(12) United States Patent
Lee et al.

(10) Patent No.: US 7,205,247 B2
(45) Date of Patent: Apr. 17, 2007

(54) ATOMIC LAYER DEPOSITION OF HAFNIUM-BASED HIGH-K DIELECTRIC

(75) Inventors: Sang-In Lee, Cupertino, CA (US); Jon S. Owyang, San Jose, CA (US); Yoshihide Senzaki, Aptos, CA (US); Aubrey L. Helms, Jr., Los Gatos, CA (US); Karem Kapkin, Watsonville, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 0 days.

(21) Appl. No.: 10/954,819

(22) Filed: Sep. 29, 2004
(Under 37 CFR 1.47)

(65) Prior Publication Data

US 2005/0235905 A1    Oct. 27, 2005

Related U.S. Application Data

(60) Provisional application No. 60/507,851, filed on Sep. 30, 2003.

(51) Int. Cl.
*H01L 21/31* (2006.01)
*H01L 21/469* (2006.01)

(52) U.S. Cl. .............................. 438/785; 257/E21.009; 427/255.31

(58) Field of Classification Search ............... 438/785; 257/E21.009; 427/255.31, 255.23
See application file for complete search history.

(56) References Cited

U.S. PATENT DOCUMENTS

| | | | |
|---|---|---|---|
| 6,787,481 B2 * | 9/2004 | Asai et al. | 438/785 |
| 2002/0064970 A1 * | 5/2002 | Chooi et al. | 438/785 |
| 2002/0195643 A1 | 12/2002 | Harada | |
| 2003/0232511 A1 * | 12/2003 | Metzner et al. | 438/785 |
| 2004/0092073 A1 * | 5/2004 | Cabral et al. | 438/287 |

* cited by examiner

*Primary Examiner*—Caridad Everhart
(74) *Attorney, Agent, or Firm*—Morgan Lewis & Bockius LLP

(57) ABSTRACT

A method of depositing a hafnium-based dielectric film is provided. The method comprises atomic layer deposition using ozone and one or more reactants comprising a hafnium precursor. A semiconductor device is also provided. The device comprises a substrate, a hafnium-based dielectric layer formed atop the substrate, and an interfacial layer formed between the substrate and the hafnium-based dielectric layer, wherein the interfacial layer comprises silicon dioxide and has a crystalline structure.

13 Claims, 3 Drawing Sheets

SiO2/HfO2 = 4 : 1
0.2/2/2/, 0.5/2/2/2

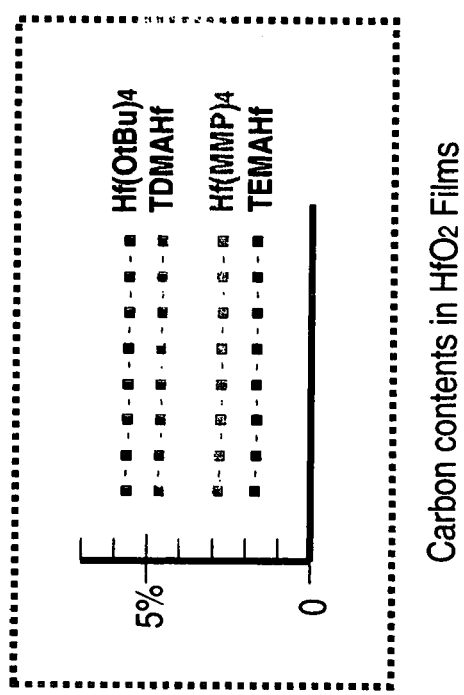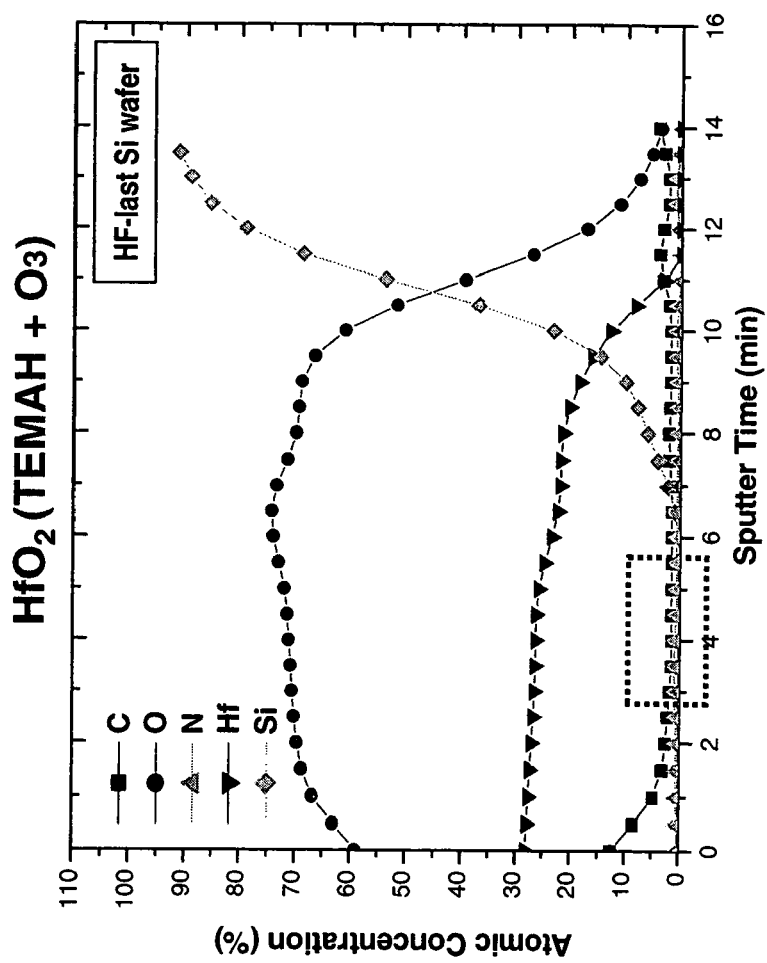

ATOMIC LAYER DEPOSITION OF HAFNIUM-BASED HIGH-K DIELECTRIC

RELATED APPLICATIONS

This application claims the benefits of and priority to U.S. Provisional Application No. 60/507,851 filed Sep. 30, 2003, the disclosure of which is hereby incorporated by reference in its entirety.

This application is related to PCT Patent Application serial No. PCT/US03/22235 filed Jul. 16, 2003 entitled Atomic Layer Deposition of High-K Dielectric Films, which claims the benefits of and priority to U.S. Provisional Application No. 60/396,723 filed Jul. 19, 2002, and U.S. Provisional Application No. 60/396,745 filed Jul. 19, 2002, the disclosure of all of which are hereby incorporated by reference in their entirety; PCT Patent Application serial No. PCT/US03/19982 filed Jun. 23, 2003 entitled Method and System for Atomic Layer Removal and Atomic Layer Exchange, which claims the benefits of and priority to U.S. Provisional Application No. 60/391,011 filed Jun. 23, 2002, the disclosure of all of which are hereby incorporated by reference in their entirety; and PCT/US03/19984 filed Jun. 23, 2003 entitled Method For Energy-Assisted Atomic Layer Deposition and Removal, which claims the benefit of U.S. Provisional Application No. 60/391,012 filed Jun. 23, 2002 and U.S. Provisional Application No. 60/396,743 filed on Jul. 19, 2002, the disclosures of all of which are hereby incorporated by reference in their entirety.

BACKGROUND

This invention relates generally to the field of semiconductors and more specifically to methods of making high-k dielectric films used in semiconductor devices and integrated circuits.

Semiconductor devices of future generations require thin dielectric films for metal-oxide-semiconductor (MOS) gate and capacitor dielectrics. Silicon dioxide ($SiO_2$) has been most commonly used as dielectrics in semiconductor devices due to its high integrity, low defect density and high band gap. As semiconductor device feature size is continuingly scaled down, the thickness of $SiO_2$ layer in the integrated circuits decreases as well. Because $SiO_2$ has a relatively low dielectric constant (k=3.9) however, such scaling soon results in a $SiO_2$ thickness to the order of ten angstroms (Å), where charge leakage due to the quantum mechanical tunneling effect becomes significant and breakdown of the $SiO_2$ layer may occur at even low gate voltage.

Alternative "high-k" dielectrics, materials with dielectric constants higher than that of $SiO_2$, i.e., materials with dielectric constants of above 4, have been developed as device feature size becomes even smaller. For example, metal oxides such as $Ta_2O_5$, $TiO_2$, $Al_2O_3$, $Y_2O_3$, $ZrO_2$, and ferroelectric BST (barium strontium titanate) have been proposed and developed for gate dielectrics. Many of these high-k dielectric materials have sufficiently high dielectric constants and sufficient integrity at time of deposition. However, some of the high-k dielectric materials either lack chemical stability in contact with silicon substrates or lack thermal stability at temperatures typical of post-deposition processes.

It is desirable that high-k dielectric materials have a high band gap and barrier height to minimize or avoid current leakage. Band gap (Eg) is an energy gap between the highest valence band and the lowest conduction band in a solid material. Barrier height refers to the potential (voltage) barrier between a metal and a semiconductor due to the presence of a high-k dielectric. Unfortunately, most high-k dielectric materials have band gaps lower than that of $SiO_2$ and their band gaps are inversely proportional to their dielectric constants.

Charge trapping and electron mobility degradation in semiconductor device performance are becoming serious challenges to integration of high-k dielectric materials. It is desirable that electrons in the gate channels have high mobility or less resistance to provide the device with high operating speed, enhanced performance characteristics, and low power consumption. Traditional $H_2O$-based high-k dielectric films contain hydroxyl (OH—) impurities, which are a major source or sites for trapping charges, resulting in electron mobility degradation of high-k films.

Accordingly, further developments in high-k dielectric materials are needed to solve these and other problems of prior art dielectric materials.

SUMMARY

The present invention provides a method of depositing hafnium-based dielectric films. The method comprises atomic layer deposition using ozone and one or more reactants comprising a hafnium precursor. The hafnium precursor can be hafnium t-butoxide ($Hf(OtBu)_4$), tetrakis (dimethylamino) hafnium (TDMAHf), tetrakis(diethylamino) hafnium (TDEAHf), $Hf(MMP)_4$, and tetrakis(ethylmethylamino) hafnium (TEMAHf). The hafnium-based dielectric film formed can be hafnium oxide or silicate. The one or more reactants and ozone can be injected into an ALD chamber though a showerhead injector. The atomic layer deposition is preferably conducted under a temperature below 400° C.

In some embodiments, the one or more reactants comprise a hafnium precursor and silicon precursor, and the hafnium and silicon precursors can be pre-mixed and co-injected into an ALD chamber during an atomic layer deposition. Alternatively, the hafnium precursor and silicon precursor can be independently and separately injected into an ALD chamber during the atomic layer deposition.

The present invention further provides a semiconductor device. The semiconductor device comprises a substrate, a hafnium-based dielectric layer formed atop the substrate, and an interfacial layer formed between the substrate and the hafnium-based dielectric layer. The interfacial layer comprises silicon dioxide and has a crystalline structure. The hafnium-based dielectric can be hafnium dioxide or hafnium silicate and may have an amorphous structure. The thickness of the interfacial layer can be in the range of about 2–5 angstroms. The device may further comprise an electrode layer atop the hafnium-based dielectric layer and be used in MOSEFTs and MOS capacitors.

BRIEF DESCRIPTION OF THE DRAWINGS

These and various other features and advantages of the present invention will be apparent upon reading of the following detail description in conjunction with the accompanying drawings and the appended claims provided below, where:

FIGS. 1A and 1B show graphs of Auger Electron Spectroscopy (AES) Analysis of a $HfO_2$ film obtained from TEMAHf and $O_3$ according to one embodiment of the present invention.

DETAIL DESCRIPTION OF VARIOUS EMBODIMENTS

Figure 2:
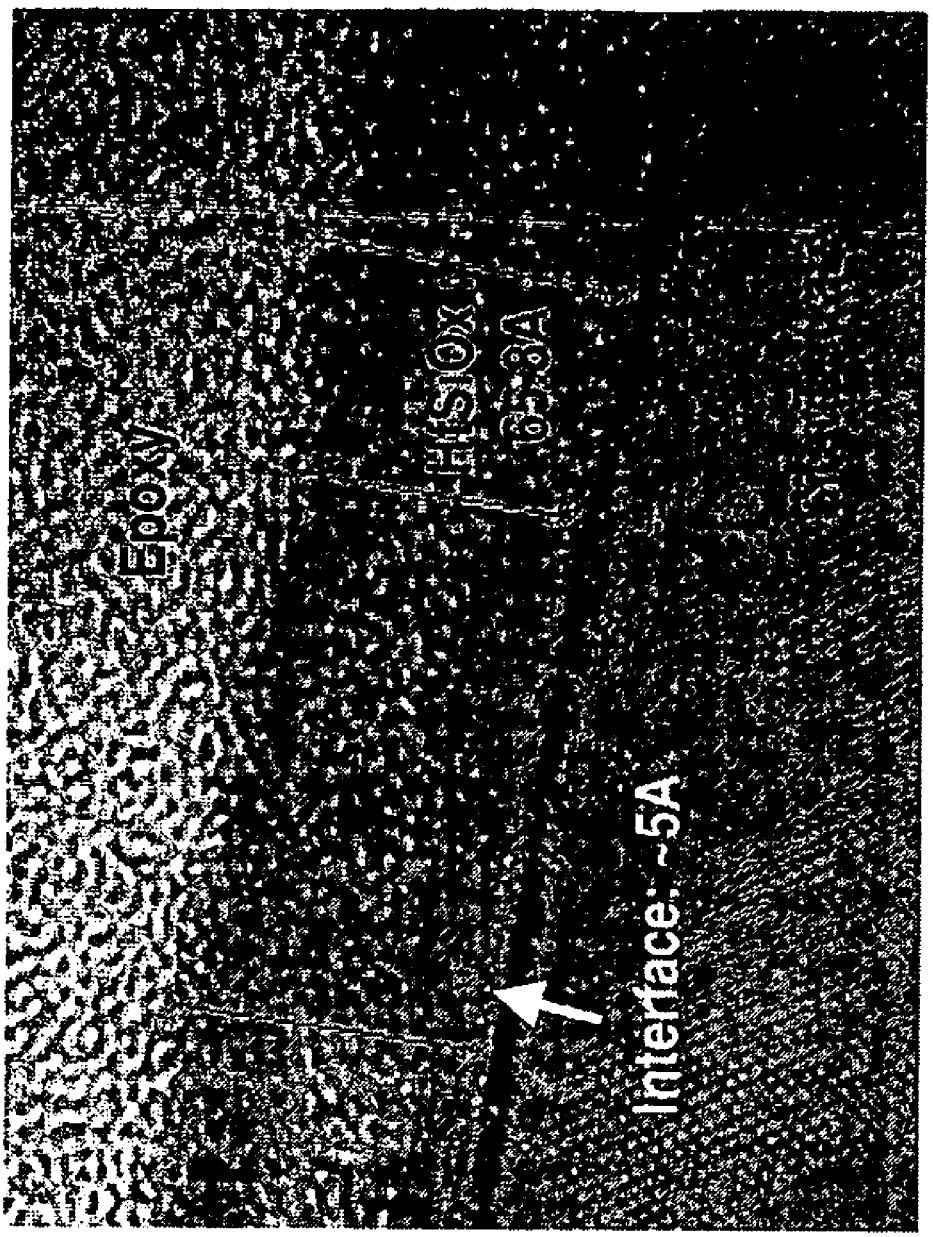
FIG. 2 is a cross sectional high-resolution transmission electron microscope (HRTEM) image for a 65 Å thick Hf—Si—O film made according to one embodiment of the present invention.

The present invention provides a method of forming high-k dielectric films useful in fabrication of semiconductor devices such as metal-oxide-semiconductor field effect transistors (MOSEFTs) and MOS capacitors. In general, the method of the present invention comprises the step of atomic layer deposition (ALD) using ozone and one or more reactants comprising a hafnium precursor. The hafnium precursor can be $Hf(OtBu)_4$, TDMAHF, TDEAHf, $Hf(MMP)_4$, and TEMAHf. The hafnium-based dielectric film formed by the method of the present invention can be hafnium oxide and hafnium silicate. In some embodiments, the one or more reactants can comprise a hafnium precursor and a silicon precursor. The hafnium and silicon precursors can be pre-mixed and co-injected into an ALD chamber. Alternatively, the hafnium and silicon precursors can be separately and alternatively injected into an ALD chamber during the process of atomic layer deposition.

The present invention also provides a semiconductor device comprising a substrate, a hafnium-based dielectric layer formed atop the substrate, and an interfacial layer formed between the substrate and the hafnium-based dielectric layer. The interfacial layer has a thickness in the range of 2–5 angstroms and comprises silicon dioxide. The interfacial layer has a crystalline structure with enhanced chemical and thermal stability. The hafnium-based dielectric layer may comprise hafnium oxides or silicates and has a thickness based on specific applications The semiconductor device can further comprise an electrode layer such as a gate electrode layer.

As stated above, the efforts to scale down semiconductor device feature size requires decreasing the thickness of dielectric layers to increase device capacitance, which in turn requires dielectric materials having high dielectric constants to minimize or avoid current leakage or dielectric layer breakdown. Typically, for a MOS device, the capacitance between the gate electrode and the underlying channel region is proportional to the dielectric constant of the dielectric layer and increases as the thickness of the gate dielectric layer decreases. Since silicon dioxide has been most commonly used for the gate dielectric material, the equivalent oxide thickness (EOT) of a high-k dielectric layer is used in comparing the performance of a high-k dielectric material and silicon dioxide. EOT refers to the thickness of $SiO_2$ needed to obtain the same gate capacitance as obtained with a thicker high-k dielectric material. For example, One (1) nanometer EOT can be obtained by ten (10) nanometer thick of a dielectric material having a dielectric constant 39 (the dielectric constant of $SiO_2$ is 3.9). According to the International Technology Roadmap for Semiconductors (ITRS), low power semiconductor devices will require dielectric layers having an EOT of 15 Å or lower for 65 nm technology nodes while high power performance devices require an EOT of 10 Å or lower. For low power consumption applications where the gate leakage current requirement is below $10^{-7}$ A/cm$^2$, a high-k dielectric film that is thermally stable and chemically stable in contact with silicon is needed.

Of advantage, the method of the present invention provides a high-k dielectric material comprising hafnium oxides or silicates. The hafnium oxide has a dielectric constant of about 25. The hafnium silicate has a dielectric constant in the range of about 10 to about 25 depending on the content of silicon in the film.

The hafnium oxide and silicate dielectric layer can be advantageously formed by atomic layer deposition (ALD). Traditional chemical vapor deposition (CVD) techniques are subject to either kinetically controlled growth reactions or diffusion-limited reactions and difficult to control for thin layer deposition. In a CVD process, it is extremely difficult to control thickness variation within 1 to 2 Å across the wafer surface area without micro-loading effect. This effect is even more pronounced in larger wafer size deposition. Further, it is challenging to achieve repeatable devices and circuit performance with high yields in the nanometer regime by using chemical vapor deposition. Also, plasma-enhanced CVD may cause charge damages to dielectric films because the accumulation of electric charges on nano-scale thin films are normally greater than the dielectric breakdown voltage even at extremely low voltages.

The formation of hafnium-based dielectric films according to the present invention is carried out by atomic layer deposition using one or more reactants comprising a hafnium precursor and ozone at a low temperature, preferably below about 400° C., more preferably below 300° C. Of advantage, the ALD process can be performed at comparatively lower temperatures, which is compatible with the industry's trend toward lower temperatures. ALD has high precursor utilization efficiency, can produce conformal thin film layers and control film thickness on an atomic scale, and can be used to "nano-engineer" complex thin films. In an ALD process deposition cycle, a monolayer of a first reactant is physi- or chemisorbed onto the substrate surface. Excess first reactant is evacuated from the reaction chamber preferably with the aid of an inert purge gas. A second reactant is then introduced into the reaction chamber and reacted with the first reactant to form a monolayer of the desired thin film via a self-limiting surface reaction. The self-limiting reaction stops once the initially adsorbed first reactant fully reacts with the second reactant. Excess second reactant is evacuated, preferably with the aid of an inert purge gas. A desired film thickness is obtained by repeating the deposition cycle as necessary. The film thickness can be controlled to atomic layer accuracy by simply counting the number of deposition cycles.

In some embodiments of the present invention, the reactant gases are introduced into a reaction chamber, preferably through what is referred to as a showerhead for even distribution of gases. A variety of reaction chambers may be used and are known in the art. The showerhead type reactor is preferred for introducing precursors when ozone is used. Two examples of suitable chambers and systems for carrying out the invention are described in U.S. Pat. Nos. 6,579,372 and 6,573,184.

In some embodiments, a hafnium precursor and ozone are alternatively introduced into an ALD chamber to form a hafnium oxide film by atomic layer deposition. In some embodiments, a hafnium precursor and a silicon precursor, and ozone are alternatively introduced into an ALD chamber to form a hafnium silicate film by atomic layer deposition. The hafnium precursor and silicon precursor can be pre-mixed in a manifold and co-injected into the ALD chamber through a showerhead to form a homogeneous hafnium silicate film. Alternatively, the hafnium precursor and silicon precursor can be alternatively introduced into an ALD chamber to form a laminated silicon oxide/hafnium oxide film. The repetition of the cycle provides a hafnium oxide or silicate film with a desired thickness.

Many types of precursors may be used with the method of the present invention and will be selected based in part on the composition of the dielectric film. The precursors can be in solid or liquid form. However, when solid precursors are used, the precursors should remain heated at all times in use to produce enough vapor pressure and to prevent condensation. Loss of heating of a solid precursor when in use or cold spots in the gas delivery system may cause the vapors to condense and clog the reactor. Solid precursors may also create detecting difficulty since they are consumed with varying surface areas. When liquid metal-organic precursors are used, care should be taken to reduce the carbon content incorporated in the film. Carbon incorporated in the film is undesirable since it may cause current leakage and degrade film performance. Examples of liquid hafnium precursors used in the present invention include, but not limited to: hafnium t-butoxide (Hf(OtBu)$_4$), tetrakis (dimethylamino) hafnium (TDMAHf), tetrakis(diethylamino) hafnium (TDEAHf), Hf(MMP)$_4$, and tetrakis(ethylmethylamino) hafnium (TEMAHf). FIGS. 1A and 1B show the atomic compositions of hafnium oxide film obtained by using various hafnium precursors. The AES analysis shows that the carbon content in the hafnium oxide film formed by TEMAHf and ozone is the lowest.

As an illustrative example, a hafnium dioxide layer was formed at a low temperature by atomic layer deposition. At a wafer temperature of 250° C. and a chamber pressure of 1 Torr, tetrakis(ethylmethylamino)hafnium (TEMAHf) was delivered into a process chamber with an Ar flow of 200 sccm for 3.5 seconds, followed by 1 second of purge and 2 second pulse of O$_3$ (180 g/m$^3$, 200 sccm), and 3 second purge. This deposition cycle provided HfO$_2$ films on a 200 mm diameter silicon substrate with a deposition rate of 1.5 Å/cycle.

Of advantage, ozone is used as an oxygen source in the atomic layer deposition in the present invention. This is in contrast to prior art methods in which H$_2$O is used as an oxygen source and as a result, hydroxyl ions (OH—) are unavoidably incorporated as impurity in the dielectric films formed and become a major source or site of fixed and trapped charges. Charge trapping in MOSFET performance is a serious challenge to the integration of high-k dielectric materials. Fixed charges are immobile charged sites within the dielectric film. These charges do not move when an electric field is applied across the dielectric film. The fixed charges can be located at or near the interface or in the bulk of the dielectric film. Interface trapped charges are located at the substrate interface and have energy states within the energy band gap. The interface-trapped charges are quantified by $D_{it}$, density of interface traps. It is desirable to have the interface-trapped charges at or below $10^{10}$ atoms/cm$^2$ (equivalent to one trapped charge per $10^5$ surface atoms).

For example, water (H$_2$O) is traditionally used as oxygen source in making high-k dielectric film such as alumina (Al$_2$O$_3$). The growth of a water-based Al$_2$O$_3$ film on a hydrophobic Si surface must first go through an incubation or start up phase before Al$_2$O$_3$ begins to be deposited, and approximately 15 cycles of ALD are needed before the Al$_2$O$_3$ film begins to grow. The chemistry of the reaction during incubation of the H$_2$O-based Al$_2$O$_3$ film is generally as follows:

$$Si+Al(CH_3)_3+H_2O \rightarrow Si+Al+O+OH^-+CH_4 \quad (1)$$

$$\rightarrow Si(OH)+Al(OH)+AlO+ \quad (2)$$

ALD deposits of such Al$_2$O$_3$ films of 10 angstroms or less is impossible since the incubation phase deposits grow to that thickness before actual Al$_2$O$_3$ growth begins. In addition, Al$_2$O$_3$ films thinner than 40 angstroms are prone to electrical leakage.

Once the incubation phase is complete, the chemistry of Al$_2$O$_3$ growth proceeds as follows:

$$2Al(CH_3)_3+3H_2O \rightarrow Al_2O_3+3CH_4 \quad (3)$$

For example, in temperature ranges around 300° C., mono layer growth proceeds with trimethyl aluminum (TMA or Al(CH$_3$)$_3$) and water vapor as precursors. Each ALD cycle adds about 0.85 Å of dielectric material. However, inherently within the ALD process with TMA and water as precursors, the following reaction also occurs:

$$Al(CH_3)_3+3H_2O \rightarrow Al(OH)_3+3CH_4. \quad (4)$$

leaving a dielectric film containing some Al(OH)$_3$. Al(OH)$_3$ tends to weaken the properties of the dielectric film. The hydroxyl ions (OH—) are a major source of fixed and trapped charges that degrade the electrical performance of the dielectric film.

The method of present invention employs ozone and hafnium and silicon precursors and shows no sign of incubation. The dielectric film grows directly on the substrate without nucleation. Further, the deposition according to the present invention occurs layer-by-layer instead of island-type growth as observed in water-based atomic layer deposition of hafnium oxide films. Island-type growth is undesirable which occurs when nuclei of the film at specific sites or islands are initially formed, and then the film grows laterally and upward from the islands. In some embodiments, the silicon substrate is treated with hydrogen fluoride (HF) acid to remove the native oxide and leave a clean silicon surface terminated with hydrogen (Si—H bonds). Native oxide, which is formed when a bare silicon surface exposed in the air, is a poor quality insulator in terms of leakage and other electrical properties, and is therefore preferably removed. The High Resolution Transmission Electron Microscope image of FIG. 2 shows that the hafnium silicate film is grown layer-by-layer according to the present invention. The amorphous hafnium silicate film shown in FIG. 3 does not exhibit any grain boundary related effect. Grain boundaries act as dopants, oxygen diffusion paths and leakage paths. The dielectric film made according to the present invention has superior thermal stability and improved leakage properties.

Silicon dioxide film has good electron mobility under an applied electric field. How to improve the electron mobility of high-k dielectric films to be equal or exceed 90% of that of SiO$_2$ film becomes a challenge in implementing high-k gate technology. Dielectric films having high electrons mobility or less resistance can provide semiconductor devices with high operating speed, enhanced performance characteristics, and low power consumption. In some embodiments, strain silicon can be used to improve electron mobility. A thin tensilely strained crystalline silicon layer is grown on a relaxed, graded buffer layer, which in turn is formed on a crystalline substrate such as silicon substrate. The buffer layer such as a Si—Ge layer is comprised of atoms having greater lattice constant or spacing than that of pure silicon. As a result, the silicon atoms being deposited on the buffer layer are "stretched" to align with the underlying lattice of the buffer layer. Electrons in such strain silicon layers have greater mobility than in conventional, relaxed silicon layers with smaller inner-atom spacing.

In some embodiments, an interfacial silicon oxide can be formed between the silicon substrate and the gate dielectric layer to take advantage of the good electron mobility of $SiO_2$. Increasing the thickness of the interfacial layer can improve the electron mobility of the film. On the other hand, in order to enhance device performance, it is desirable to minimize the thickness of the interfacial layer to reduce EOT. There is a compromise between achieving a low EOT and maintaining a high electron mobility. The present invention provides a method of making a thin crystalline interfacial silicon oxide layer and a method of controlling the thickness of the interfacial layer.

Figure 3:
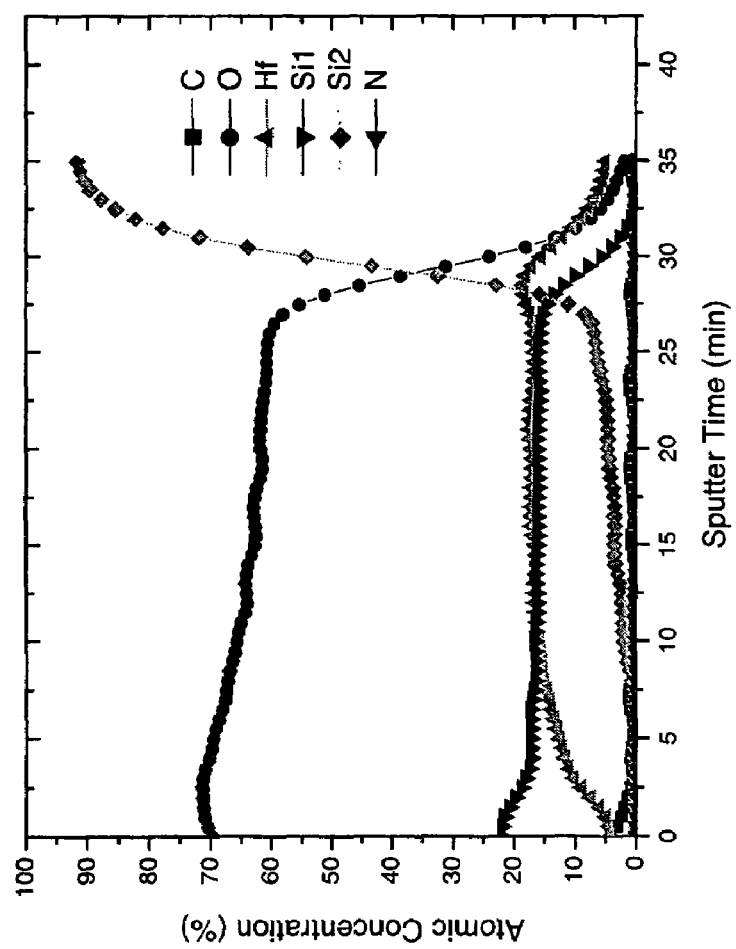
FIG. 3 illustrates the atomic concentration of various components of a $SiO_2/HfO_2$ film made according to one embodiment of the present invention.

In an illustrative example not intended to limit the scope of the invention, a silicon precursor such as tetramethyldisiloxane (TMDSO), a hafnium precursor such as tetrakis ethylmethylamino hafnium (TEMAHf), and Ozone at concentration of 180 g/m$^3$ were pulsed separately and sequentially into an ALD chamber which was maintained at a pressure from 0.5 to 6 Torr, preferably at about 1 Torr. The flow rate of TMDSO, TEMAHf and ozone was 200 sccm respectively. TMDSO precursor was pulsed into the ALD chamber for 0.2 second, followed by 2 seconds inert gas purge, 2 seconds ozone pulse and 2 seconds inert gas purge. Then TEMAHf precursor was pulsed into the ALD chamber for 0.4 second, followed by 2 seconds inert gas purge, 2 seconds ozone pulse and 2 seconds inert gas purge. A laminate $SiO_2/HfO_2$ film was formed atop a silicon substrate. A thin crystalline interface $SiO_2$ layer was formed between the silicon substrate and the laminate film, as shown in Transmission Electron Microscope image of FIG. 2. The substrate temperature could affect the thickness of the crystalline interface layer. A lower substrate temperature could result in a thinner interface layer. At a temperature of about 250° C., an interface layer of less than 5 Å was formed. Wafer pretreatment such as HF-last treatment may also affect the interface thickness. FIG. 3 shows the atomic concentration of various components of a $SiO_2/HfO_2$ film made according to the present invention.

The crystalline interfacial layer formed according to the present invention is distinct from the conventional interfacial silicon dioxide layer. Traditional interfacial oxide layer is formed by up-diffusion of silicon from the silicon substrate into high-k dielectric such as hafnium oxide layer. Traditional interfacial layer is a transitional interface with a varying dielectric constant (k-transition), which is undesirable and should be depressed. According to some embodiments of the present invention, a thin crystalline interfacial silicon oxide is formed.

The method of making dielectric films according to the present invention can be used in fabrication of semiconductor devices such as MOSFETs and MOS capacitors. For example, the MOSFET can comprise a suitable semiconductor substrate, a dielectric layer atop the substrate formed by atomic layer deposition according to the present invention, an electrode layer formed atop the dielectric layer, and a crystalline interfacial layer formed between the substrate and the dielectric layer.

While the present invention is disclosed by reference to the preferred embodiments and examples detailed above, it is to be understood that these examples are intended in an illustrative rather than limiting sense, as it is contemplated that modifications and combinations will readily occur to those skilled in the art, which modifications and combinations will be within the scope of the invention and the scope of the appended claims

What is claimed is:

1. A method of depositing a hafnium-based dielectric film comprising the step of atomic layer deposition using ozone and one or more reactants comprising a hafnium precursor wherein the hafnium precursor comprises TDMAHf, TDEAHf, Hf(MMP)$_4$, or TEMAHf.

2. The method of claim 1 wherein the atomic layer deposition is conducted under a temperature below 400° C.

3. The method of claim 1 wherein the one or more reactants and ozone are injected into an ALD chamber through a showerhead injector.

4. The method of claim 1 wherein the one or more reactants further comprise a silicon precursor and the hafnium-based dielectric film comprises a hafnium silicate layer atop a substrate and an interfacial silicon oxide layer between the hafnium silicate layer and the substrate.

5. The method of claim 4 wherein the silicon precursor and hafnium precursor are mixed and co-injected into an ALD chamber during the atomic layer deposition.

6. The method of claim 4 wherein the silicon precursor and hafnium precursors are alternatively and independently injected into an ALD chamber during the atomic layer deposition.

7. A semiconductor device comprising:
a substrate;
a hafnium-based dielectric layer formed atop the substrate; and
an interfacial layer formed between the substrate and the hafnium-based dielectric layer, wherein the interfacial layer comprises silicon dioxide and has a crystalline structure.

8. The semiconductor device of claim 7 wherein the hafnium-based dielectric is an amorphous.

9. The semiconductor device of claim 7 wherein the hafnium-based dielectric comprises hafnium dioxide.

10. The semiconductor device of claim 7 wherein the hafnium-based dielectric comprises hafnium silicates.

11. The semiconductor device of claim 7 wherein the thickness of the interfacial layer is in the range of about 2–5 angstroms.

12. The semiconductor device of claim 7 further comprising an electrode layer atop the hafnium-based dielectric layer.

13. The semiconductor device of claim 12 wherein the electrode layer is a gate electrode.

* * * * *